United States Patent
Nitta

(10) Patent No.: US 12,262,580 B2
(45) Date of Patent: Mar. 25, 2025

(54) DISPLAY DEVICE INCLUDING AN ORGANIC LIGHT-EMITTING DIODE (OLED)

(71) Applicant: Japan Display Inc., Tokyo (JP)

(72) Inventor: Jun Nitta, Tokyo (JP)

(73) Assignee: Japan Display Inc., Tokyo (JP)

( * ) Notice: Subject to any disclaimer, the term of this patent is extended or adjusted under 35 U.S.C. 154(b) by 265 days.

(21) Appl. No.: 17/545,440

(22) Filed: Dec. 8, 2021

(65) Prior Publication Data

US 2022/0199937 A1    Jun. 23, 2022

(30) Foreign Application Priority Data

Dec. 17, 2020   (JP) .................. 2020-209472

(51) Int. Cl.
*H10K 50/822*    (2023.01)
*H10K 59/122*    (2023.01)
*H10K 71/16*     (2023.01)

(52) U.S. Cl.
CPC ......... *H10K 50/822* (2023.02); *H10K 59/122* (2023.02); *H10K 71/164* (2023.02)

(58) Field of Classification Search
CPC .. H10K 59/122; H10K 50/822; H10K 50/131; H10K 50/16; H10K 50/171; H10K 50/15; H10K 50/156; H10K 50/157
See application file for complete search history.

(56) References Cited

U.S. PATENT DOCUMENTS

| | | |
|---|---|---|
| 2004/0160170 A1 | 8/2004 | Sato et al. |
| 2005/0127825 A1 | 6/2005 | Bae et al. |
| 2008/0180686 A1* | 7/2008 | Sakai ............. G02B 5/201 347/20 |
| 2009/0009069 A1 | 1/2009 | Takata |
| 2009/0273279 A1 | 11/2009 | Chino et al. |
| 2010/0193817 A1 | 8/2010 | Amamiya et al. |

(Continued)

FOREIGN PATENT DOCUMENTS

| | | |
|---|---|---|
| JP | 2000-195677 A | 7/2000 |
| JP | 2004-207217 A | 7/2004 |

(Continued)

OTHER PUBLICATIONS

Office Action issued on Sep. 17, 2024, in corresponding Japanese Application No. 2020-209472, 11 pages.

(Continued)

*Primary Examiner* — Daniel Whalen
*Assistant Examiner* — Seyon Ali-Simah Punchbeddell
(74) *Attorney, Agent, or Firm* — Maier & Maier, PLLC

(57) ABSTRACT

According to one embodiment, a display device includes first and second lower electrodes, a second insulating layer arranged between the first and second lower electrodes, and having first and second openings overlapping the first and second lower electrodes, a partition arranged on the second insulating layer, a first organic layer arranged in the first opening and covering the first lower electrode, and a first upper electrode covering the first organic layer. The partition has a first layer formed of a metal material and a second layer protruding from a first side surface of the first layer toward the first opening. The first upper electrode is in contact with the first side surface.

8 Claims, 11 Drawing Sheets

(56) References Cited

U.S. PATENT DOCUMENTS

| | | | |
|---|---|---|---|
| 2012/0205675 A1* | 8/2012 | Yamazaki | H10K 59/86 |
| | | | 257/40 |
| 2012/0205700 A1 | 8/2012 | Tanada et al. | |
| 2013/0001620 A1* | 1/2013 | Sugisawa | H10K 59/122 |
| | | | 257/E33.062 |
| 2015/0357388 A1* | 12/2015 | Pang | H10K 71/00 |
| | | | 438/23 |
| 2016/0079325 A1* | 3/2016 | Lee | H10K 59/122 |
| | | | 438/26 |
| 2017/0010712 A1* | 1/2017 | Yoshizumi | H10K 59/40 |
| 2018/0122875 A1* | 5/2018 | Bang | H10K 59/1213 |
| 2021/0091158 A1 | 3/2021 | Kasahara | |

FOREIGN PATENT DOCUMENTS

| | | |
|---|---|---|
| JP | 2008-135325 A | 6/2008 |
| JP | 2009-32673 A | 2/2009 |
| JP | 2009266803 A | 11/2009 |
| JP | 2010-118191 A | 5/2010 |
| JP | 2012182121 A | 9/2012 |
| JP | 2014038782 A | 2/2014 |
| WO | WO 2019/026511 A1 | 2/2019 |

OTHER PUBLICATIONS

Office Action issued on Nov. 21, 2024, in corresponding Chinese Application No. 202111549408.0, 12 pages.
Office Action issued Jun. 13, 2024, in corresponding Chinese Application No. 202111549408.0, 18 pages.

\* cited by examiner

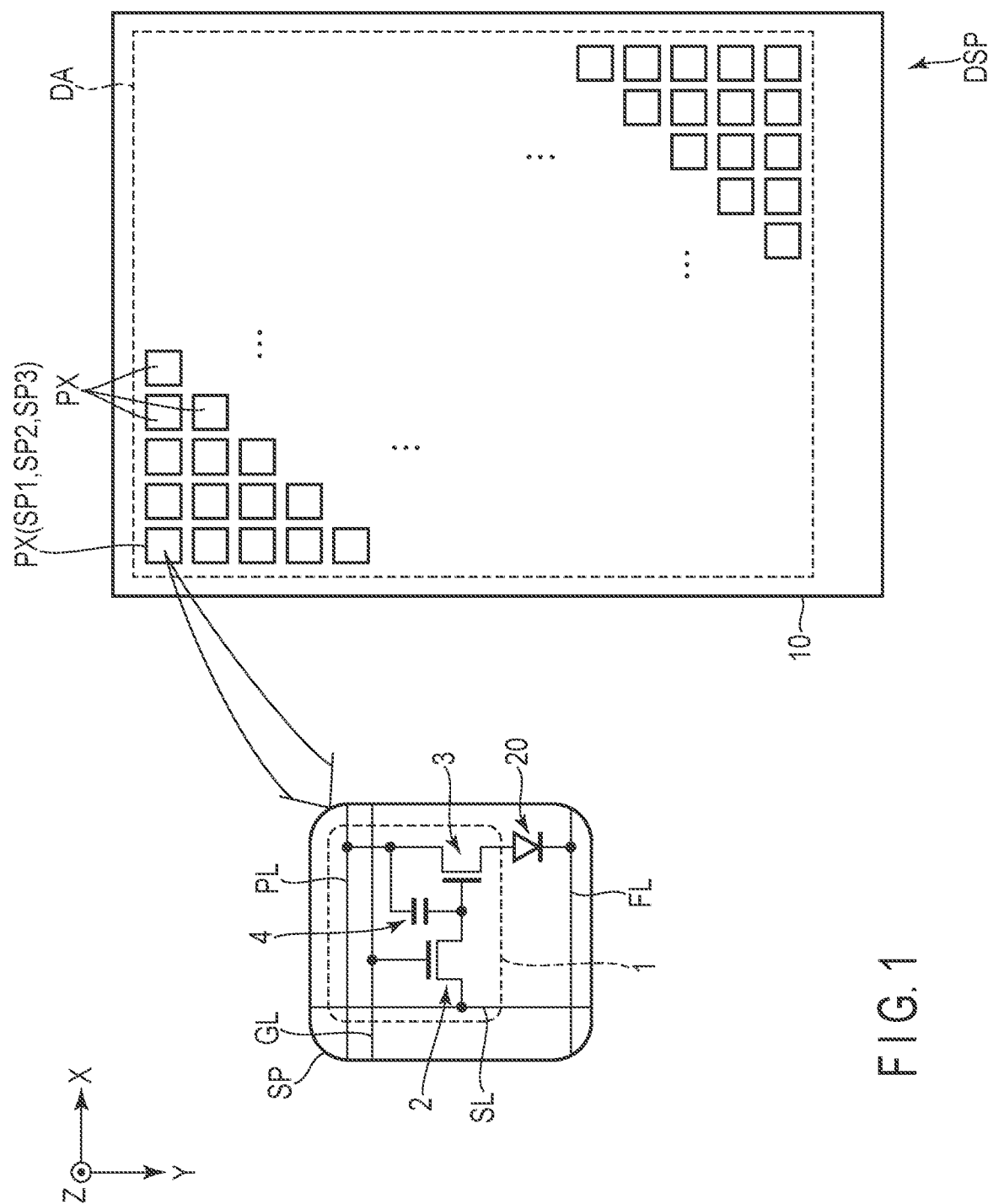
F I G. 1

DISPLAY DEVICE INCLUDING AN ORGANIC LIGHT-EMITTING DIODE (OLED)

CROSS-REFERENCE TO RELATED APPLICATIONS

This application is based upon and claims the benefit of priority from Japanese Patent Application No. 2020-209472, filed Dec. 17, 2020, the entire contents of which are incorporated herein by reference.

FIELD

Embodiments described herein relate generally to a display device.

BACKGROUND

Recently, a display device employing an organic light-emitting diode (OLED) as a display element has been put into practical use. The display element comprises an organic layer between a pixel electrode and a common electrode. The organic layer includes function layers such as a hole transport layer and an electron transport layer in addition to a light emitting layer. This organic layer is formed by, for example, a vacuum vapor deposition method.

For example, in the case of vapor deposition using mask, a fine mask having openings corresponding to respective pixels is applied. However, due to the accuracy of processing the fine mask, the deformation of the openings and the like, the accuracy of forming a thin film by vapor deposition may be reduced. Therefore, there is demand to form the organic layer having a desired shape without applying the fine mask. For example, an end face of the organic layer may not be formed at a predetermined position, and the performance of the display element may be degraded.

BRIEF DESCRIPTION OF THE DRAWINGS

FIG. 1 is an illustration showing a configuration example of a display device DSP according to a present embodiment.

FIG. 10 is an illustration for explaining an example of a vapor deposition method of an organic layer OR.

FIG. 11 is an illustration for explaining another example of the vapor deposition method of the organic layer OR.

DETAILED DESCRIPTION

Figure 2:
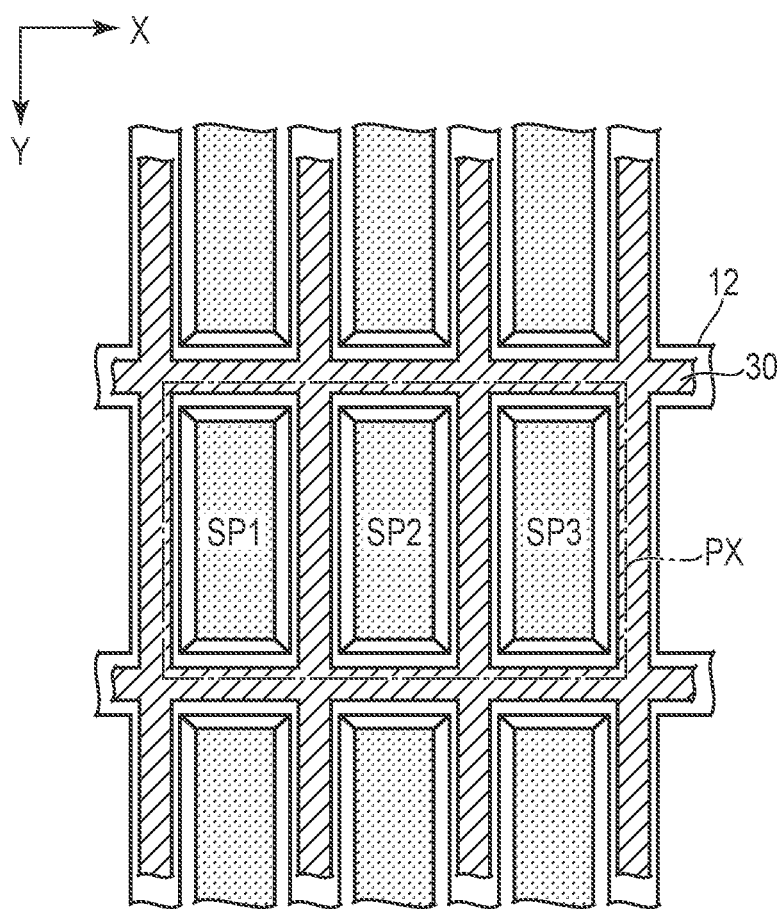
FIG. 2 is a plan view showing an example of a pixel PX shown in FIG. 1.

In general, according to one embodiment, there is provided a display device comprising an insulating substrate, a first insulating layer arranged on the insulating substrate, a first lower electrode and a second lower electrode arranged on the first insulating layer, a second insulating layer arranged between the first lower electrode and the second lower electrode on the first insulating layer, and having a first opening overlapping the first lower electrode and a second opening overlapping the second lower electrode, a partition arranged on the second insulating layer, a first organic layer including a light emitting layer, arranged in the first opening, and covering the first lower electrode, and a first upper electrode covering the first organic layer. The partition has a first layer being in contact with the second insulating layer, formed of a metal material, and having a first side surface facing the first opening, a second side surface facing the second opening and a first upper surface, and a second layer being in contact with the first upper surface, and protruding from the first side surface toward the first opening. The first upper electrode is in contact with the first side surface.

The present embodiment will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed description thereof which is considered redundant is omitted unless necessary.

In the drawings, in order to make understanding easier, an X-axis, a Y-axis and a Z-axis which are orthogonal to each other are shown as needed. A direction along the X-axis is referred to as an X direction or a first direction, a direction along the Y-axis is referred to as a Y direction or a second direction, and a direction along the Z-axis is referred to as a Z direction or a third direction. A plane defined by the X-axis and the Y-axis is referred to as an X-Y plane, and a plane defined by the X-axis and the Z-axis is referred to as an X-Z plane. Viewing the X-Y plane is referred to as planar view.

A display device DSP according to the present embodiment is an organic electroluminescent display device comprising an organic light-emitting diode (OLED) as a display element, and is mounted on a television, a personal computer, a mobile terminal, a mobile telephone and the like. The display element described below can be applied as a light emitting element of an illumination device, and can be used for another purpose in another electronic device such as an illumination device.

FIG. 1 is an illustration showing a configuration example of a display device DSP according to the present embodiment. The display device DSP comprises a display portion DA where an image is displayed on an insulating base material 10. The base material 10 is an insulating substrate, and may be glass or flexible resin film.

The display portion DA comprises a plurality of pixels PX arranged in a matrix in the first direction X and the second direction Y. The pixel PX comprises a plurality of sub-pixels SP1, SP2 and SP3. In one example, the pixel PX comprises a red sub-pixel SP1, a green sub-pixel SP2 and a blue sub-pixel SP3. Note that the pixel PX may comprise four or more sub-pixels including a sub-pixel of another color such as white in addition to the sub-pixels of these three colors.

A configuration example of one sub-pixel SP included in the pixel PX will be briefly described.

That is, the sub-pixel SP comprises a pixel circuit 1 and a display element 20 which is drive controlled by the pixel circuit 1. The pixel circuit 1 comprises a pixel switch 2, a drive transistor 3 and a capacitor 4. The pixel switch 2 and the drive transistor 3 each are, for example, a switch element composed of a thin-film transistor.

Regarding the pixel switch 2, a gate electrode is connected to a scanning line GL, a source electrode is connected to a signal line SL, and a drain electrode is connected to one electrode constituting the capacitor 4 and a gate electrode of the drive transistor 3. Regarding the drive transistor 3, a source electrode is connected to the other electrode constituting the capacitor 4 and a power line PL, and a drain electrode is connected to an anode of the display element 20. A cathode of the display element 20 is connected to a feed line FL. Note that the configuration of the pixel circuit 1 is not limited to the illustrated example.

The display element 20 is an organic light-emitting diode (OLED) which is a light emitting element. For example, the sub-pixel SP1 comprises a display element which emits light corresponding to a red wavelength, the sub-pixel SP2 comprises a display element which emits light corresponding to a green wavelength, and the sub-pixel SP3 comprises a display element which emits light corresponding to a blue wavelength. The pixel PX comprises the sub-pixels SP1, SP2 and SP3 of different display colors so that multicolor display can be realized.

However, the display elements 20 of the sub-pixels SP1, SP2 and SP3 may be configured to emit light of the same color. Accordingly, monochrome display can be realized.

In addition, when the display elements 20 of the sub-pixels SP1, SP2 and SP3 are configured to emit white light, color filters opposed to the display elements 20 may be arranged. For example, the sub-pixel SP1 comprises a red color filter opposed to the display element 20, the sub-pixel SP2 comprises a green color filter opposed to the display element 20, and the sub-pixel SP3 comprises a blue color filter opposed to the display element 20. Accordingly, multicolor display can be realized.

Alternatively, when the display elements 20 of the sub-pixels SP1, SP2 and SP3 are configured to emit ultraviolet light, light conversion layers opposed to the display elements 20 may be arranged so that multicolor display can be realized.

The configuration of the display element 20 will be described later.

FIG. 2 is a plan view showing an example of the pixel PX shown in FIG. 1.

The sub-pixels SP1, SP2 and SP3 constituting one pixel PX are substantially in the form of a rectangle extending in the second direction Y, and are arranged in the first direction X.

An insulating layer 12 which will be described later is in the form of a lattice extending in the first direction X and the second direction Y in planar view, and surrounds each of the sub-pixels SP1, SP2 and SP3. A partition 30 which will be described later is in the form of a lattice extending in the first direction X and the second direction Y in planar view, and is arranged on the insulating layer 12.

Figure 3:
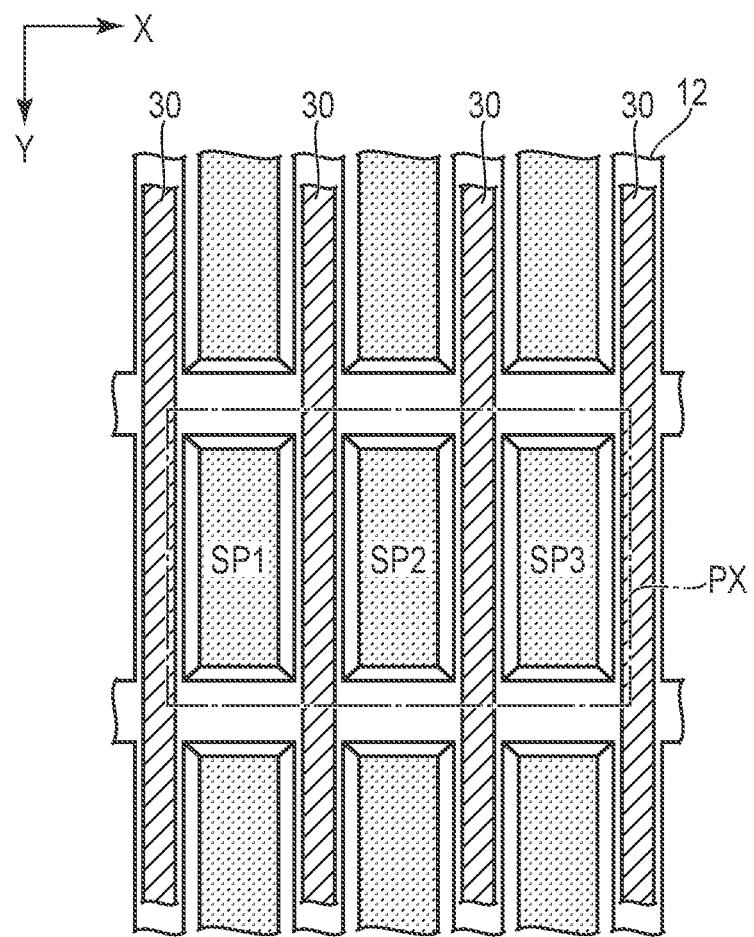
FIG. 3 is a plan view showing another example of the pixel PX shown in FIG. 1.

FIG. 3 is a plan view showing another example of the pixel PX shown in FIG. 1.

The example shown in FIG. 3 is different from the example shown in FIG. 2 in that the partitions 30 are in the form of stripes. The partitions 30 each extend in the second direction Y, and are arranged in the first direction X. The sub-pixels SP1, SP2 and SP3 each are located between the adjacent partitions 30. That is, the sub-pixel and the partition are arranged alternately in the first direction X.

The insulating layer 12 is in the form of a lattice in the same manner as the example shown in FIG. 2, but the insulating layers 12 may be in the form of stripes in the same manner as the partitions 30.

The outer shape of each sub-pixel shown in FIGS. 2 and 3 corresponds to the outer shape of a lower electrode of the display element or a light emitting area of the display element. However, the illustration is simplified and does not necessarily reflect the actual shape.

Figure 4:
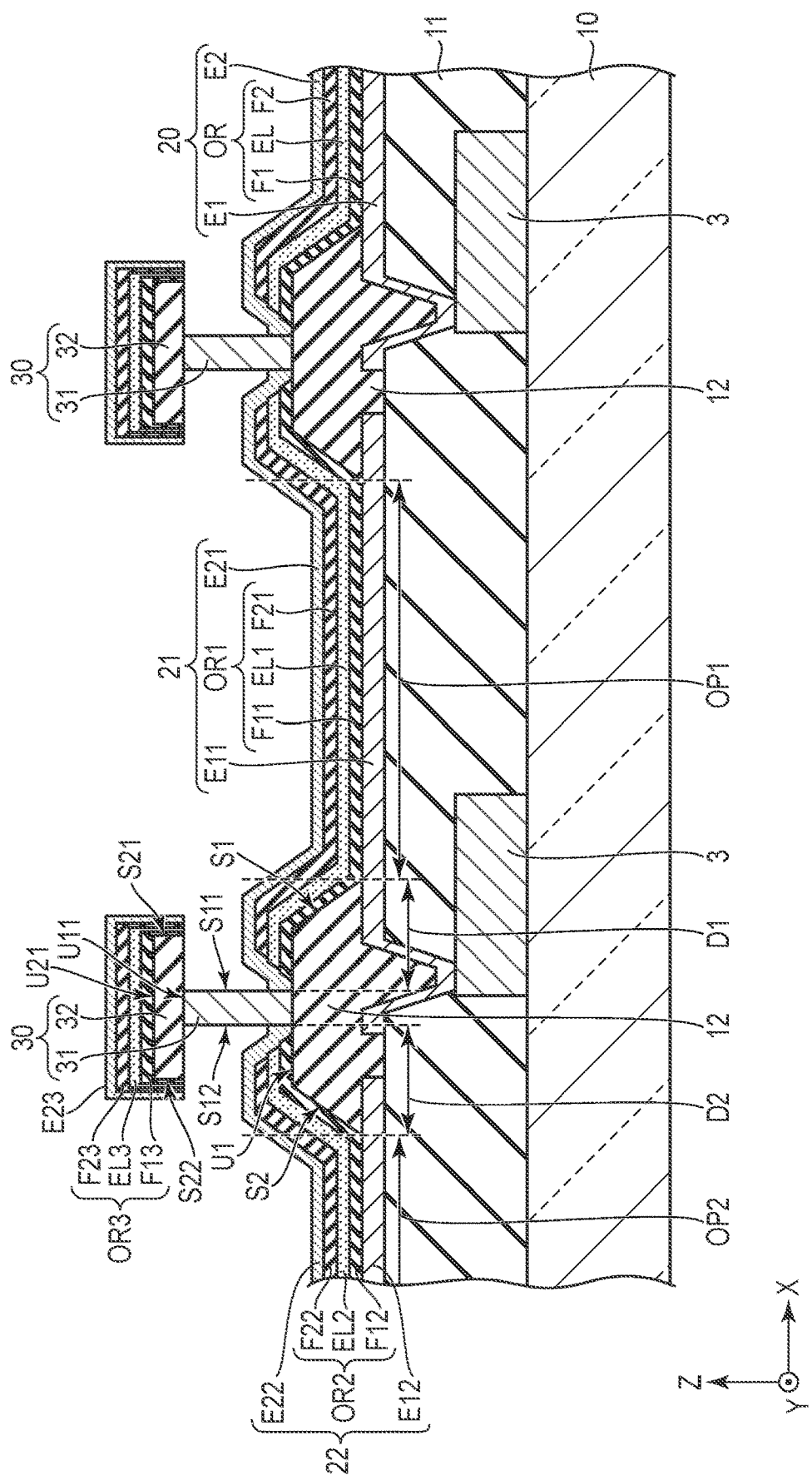
FIG. 4 is a cross-sectional view showing an example of a display element 20.

FIG. 4 is a cross-sectional view showing an example of the display element 20.

The pixel circuit 1 shown in FIG. 1 is arranged on the base material 10, and is covered with the insulating layer 11. FIG. 4 simply illustrates the drive transistor 3 included in the pixel circuit 1. The insulating layer (first insulating layer) 11 corresponds to the underlayer of the display element 20, and is, for example, an organic insulating layer.

The insulating layer (second insulating layer) 12 is arranged on the insulating layer 11. The insulating layer 12 is, for example, an organic insulating layer. The insulating layer 12 is formed to delimit the display element 20 or the sub-pixel, and may be referred to as a rib, a partition or the like.

The display element 20 comprises a lower electrode E1, an organic layer OR and an upper electrode E2. The lower electrode E1 is an electrode arranged for each sub-pixel or each display element, and is electrically connected to the drive transistor 3. This lower electrode E1 may be referred to as a pixel electrode, an anode or the like. The upper electrode E2 is an electrode arranged for each sub-pixel or each display element, but the upper electrodes E2 are electrically connected to each other over the sub-pixels or the display elements which are adjacent to each other. This upper electrode E2 may be referred to as a common electrode, a counter electrode, a cathode or the like.

The lower electrode E1 is arranged on the insulating layer 11, and a peripheral portion thereof is covered with the insulating layer 12. The lower electrode E1 is a transparent electrode formed of a transparent conductive material such as indium tin oxide (ITO) or indium zinc oxide (IZO), for example. Note that the lower electrode E1 may be a metal electrode formed of a metal material such as silver or aluminum. In addition, the lower electrode E1 may be a stack of a transparent electrode and a metal electrode. For example, the lower electrode E1 may be composed as a stack of layers stacked in the order of a transparent electrode, a metal electrode and a transparent electrode or may be composed as a stack of three or more layers.

The organic layer OR is arranged on the lower electrode E1. This organic layer OR includes a light emitting layer EL. In the example shown in FIG. 4, the organic layer OR further includes function layers F1 and F2. The function layer F1, the light emitting layer EL and the function layer F2 are stacked in order from the lower electrode E1 side. The function layers F1 and F2 each are, for example, a hole injection layer, a hole transport layer, a hole blocking layer, an electron injection layer, an electron transport layer or an electrode blocking layer, but may be another function layer. In addition, the illustrated function layers F1 and F2 each are not limited to a single layer but may be a stack of a plurality of function layers. Furthermore, at least one of the function layers F1 and F2 may be omitted.

The upper electrode E2 covers the organic layer OR. The upper electrode E2 is a transparent electrode formed of a transparent conductive material such as ITO or IZO, for example. Note that the upper electrode E2 may be a transflective metal electrode formed of a metal material such as magnesium or silver. The upper electrode E2 is electrically connected to a feed line arranged in the display portion DA or a feed line arranged outside the display portion DA.

When the potential of the lower electrode E1 is high relative to the potential of the upper electrode E2, the lower electrode E1 corresponds to an anode and the upper electrode E2 corresponds to a cathode. In addition, when the potential of the upper electrode E2 is high relative to the potential of the lower electrode E1, the upper electrode E2 corresponds to an anode and the lower electrode E1 corresponds to a cathode.

As an example, when the lower electrode E1 corresponds to an anode, the function layer F1 between the light emitting layer EL and the lower electrode E1 includes at least one of a hole injection layer and a hole transport layer, and the function layer F2 between the light emitting layer EL and the upper electrode E2 includes at least one of an electron transport layer and an electron injection layer.

Here, attention is focused on two display elements which are adjacent to each other in the first direction X. For the sake of convenience, the display element located at the center of the drawing is described as a display element 21, and the display element located on the left side of the drawing is described as a display element 22.

The display element 21 comprises a lower electrode (first lower electrode) E11, an organic layer (first organic layer) OR1 and an upper electrode (first upper electrode) E21. The organic layer OR1 comprises a function layer F11, a light emitting layer EL1 and a function layer F21.

The display element 22 comprises a lower electrode (second lower electrode) E12, an organic layer (second organic layer) OR2 and an upper electrode (second upper electrode) E22. The organic layer OR2 comprises a function layer F12, a light emitting layer EL2 and a function layer F22. The lower electrodes E11 and E12 are arranged with a space in the first direction X.

The insulating layer 12 is arranged between the lower electrode E11 and the lower electrode E12. In addition, the insulating layer 12 has an opening OP1, an opening OP2, sloping surfaces S1 and S2, and an upper surface U1.

The opening OP1 is formed in an area overlapping the lower electrode E11, and is a through hole penetrating the insulating layer 12 to the lower electrode E11. The peripheral portion of the lower electrode E11 is covered with the insulating layer 12, and the central portion of the lower electrode E11 is exposed from the insulating layer 12 in the opening OP1.

The opening OP2 is formed in an area overlapping the lower electrode E12, and is a through hole penetrating the insulating layer 12 to the lower electrode E12. The peripheral portion of the lower electrode E12 is covered with the insulating layer 12, and the central portion of the lower electrode E12 is exposed from the insulating layer 12 in the opening OP2.

The upper surface U1 and the sloping surfaces S1 and S2 correspond to a surface of the insulating layer 12 between the opening OP1 and the opening OP2. The sloping surface S1 faces the opening OP1. The sloping surface S2 faces the opening OP2. The upper surface U1 is located between the sloping surfaces S1 and S2. Note that the upper surface U1 and the sloping surfaces S1 and S2 each are, for example, a flat surface but may be a curved surface.

The organic layer OR1 is arranged in the opening OP1 and covers the lower electrode E11. In the example shown in FIG. 4, the organic layer OR1 is arranged on the sloping surface S1, and is also arranged on a part of the upper surface U1. The upper electrode E21 is stacked on the organic layer OR1. A part of the organic layer OR1 located between the lower electrode E11 and the upper electrode E21 without via the insulating layer 12 can form a light emitting area of the display element 21. A part of the organic layer OR1 arranged on the sloping surface S1 and the upper surface U1 is located between the insulating layer 12 and the upper electrode E21, and therefore hardly emits light.

The organic layer OR2 is arranged in the opening OP2 and covers the lower electrode E12. In the example shown in FIG. 4, the organic layer OR2 is arranged on the sloping surface S2, and is also arranged on a part of the upper surface U1. On the upper surface U1, the organic layer OR2 is separated from the organic layer OR1. The upper electrode E22 is stacked on the organic layer OR2. The upper electrode E22 is separated from the upper electrode E21. A part of the organic layer OR2 located between the lower electrode E12 and the upper electrode E22 without via the insulating layer 12 can form a light emitting area of the display element 22. A part of the organic layer OR2 arranged on the sloping surface S2 and the upper surface U1 is located between the insulating layer 12 and the upper electrode E22, and therefore hardly emits light.

The partition 30 is located between the display element 21 and the display element 22, and is arranged on the insulating layer 12. More specifically, the partition 30 has a first layer 31 and a second layer 32.

The first layer 31 is in contact with the upper surface U1 of the insulating layer 12, and is arranged between the organic layer OR1 and the organic layer OR2 and between the upper electrode E21 and the upper electrode E22. The first layer 31 is formed of a metal material. That is, the first layer 31 is a conductor. The first layer 31 has a first side surface S11 facing the opening OP1, a second side surface S12 facing the opening OP2, and a first upper surface U11 between the first side surface S11 and the second side surface S12. This first layer 31 is in the form of a lattice shown in FIG. 2 or in the form of a stripe shown in FIG. 3 in planar view.

The second layer 32 is in contact with the first upper surface U11, and is separated from the insulating layer 12. The second layer 32 may be a conductor formed of a metal material or may be an insulator formed of an insulating material. The second layer 32 protrudes from the first side surface S11 toward the opening OP1, and protrudes from the second side surface S12 toward the opening OP2. The second layer 32 has a side surface S21 facing the opening OP1, a side surface S22 facing the opening OP2, and a second upper surface U21 between the side surface S21 and the side surface S22. This second layer 32 overlaps the first layer 31 and is in the form of a lattice as shown in FIG. 2 or in the form of a stripe as shown in FIG. 3 in planar view.

In the illustrated cross section, the width of the second layer 32 is greater than the width of the first layer 31. The width of the first layer 31 corresponds to the maximum distance along the first direction X between the first side surface S11 and the second side surface S12. The width of the second layer 32 corresponds to the maximum distance along the first direction X between the side surface S21 and the side surface S22.

The upper electrode E21 is in contact with a part of the first side surface S11 of the first layer 31 which is close to the insulating layer 12. The upper electrode E21 exposes a part of the first side surface S11 which is close to the second layer 32.

The upper electrode E22 is in contact with a part of the second side surface S12 of the first layer 31 which is close to the insulating layer 12. The upper electrode E22 exposes a part of the second side surface S12 which is close to the second layer 32.

Accordingly, the upper electrodes E21 and E22 are separated from each other along the first direction X but are electrically connected to the partition 30. In other words, the upper electrode E21 is electrically connected to the upper electrode E22 via the partition 30 (or the first layer 31).

The organic layer OR1 is separated from the first side surface S11. The upper electrode E21 is in contact with the upper surface U1 of the insulating layer 12 between the first side surface S11 and the organic layer OR1. In addition, the upper electrode E21 covers the peripheral portion of the organic layer OR1. That is, the end faces of the function layer F11, the light emitting layer EL1 and the function layer F21 are covered with the upper electrode E21.

The organic layer OR2 is separated from the second side surface S12. The upper electrode E22 is in contact with the upper surface U1 of the insulating layer 12 between the second side surface S12 and the organic layer OR2. In addition, the upper electrode E22 covers the peripheral portion of the organic layer OR2. That is, the end faces of the function layer F12, the light emitting layer EL2 and the function layer F22 are covered with the upper electrode E22.

Regarding the position of the partition 30 on the insulating layer 12, for example, the partition 30 is located at substantially the center of the upper surface U1. That is, a distance D1 between the first side surface S11 and the opening OP1 is substantially equal to a distance D2 between the second side surface S12 and the opening OP2.

An organic layer (third organic layer) OR3 covers the second upper surface U21 of the second layer 32. In the example shown in FIG. 4, the organic layer OR3 also covers the side surfaces S21 and S22. The organic layer OR3 is covered with an upper electrode (third upper electrode) E23.

The organic layer OR3 comprises a function layer F13, a light emitting layer EL3 and a function layer F23.

The function layer F13 is formed of the same material as the function layers F11 and F12. The function layer F23 is formed of the same material as the function layers F21 and F22. That is, the organic layer OR1, the organic layer OR2 and the organic layer OR3 each include at least one of the hole injection layer, the hole transport layer, the hole blocking layer, the electron injection layer, the electron transport layer and the electron blocking layer described above.

The light emitting layer EL3 is formed of the same material as the light emitting layers EL1 and EL2. That is, the organic layer OR1, the organic layer OR2 and the organic layer OR3 each include the light emitting layer of the same color. Alternatively, the organic layer OR1, the organic layer OR2 and the organic layer OR3 are a common layer.

However, the first side surface S11 and the second side surface S12 of the first layer 31 are exposed from the organic layer OR3 and the upper electrode E23. That is, the organic layer OR3 is separated from the organic layers OR1 and OR2. In addition, the upper electrode E23 is separated from the upper electrodes E21 and E22.

The above-described partition 30 is arranged between the adjacent display elements 20 or on the upper surface U1 of the insulating layer 12. The upper electrode E2 constituting each display element 20 is in contact with and electrically connected to the first side surface S11 or the second side surface S12 of the first layer 31. When attention is focused on each display element 20, the partition 30 is arranged on both sides of the opening OP, and one end of the upper electrode E2 is in contact with one side surface of the first layer 31, and the other end of the upper electrode E2 is in contact with the other side surface of the first layer 31. Accordingly, the upper electrodes E2 of the display elements 20 arranged in the display portion DA are electrically connected to each other.

Figure 5:
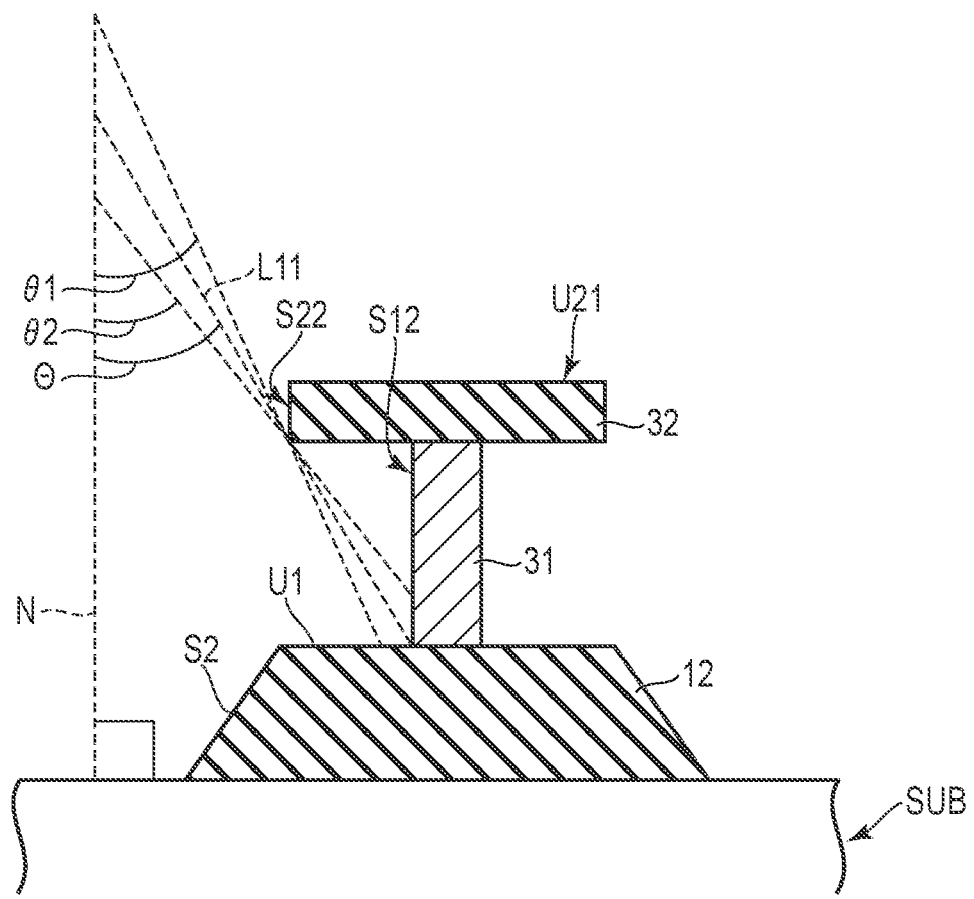
FIG. 5 is an illustration for explaining a process of forming a cross-sectional structure shown in FIG. 4.

FIG. 5 is an illustration for explaining a process of forming the cross-sectional structure shown in FIG. 4.

For example, after the lower electrode E1 is formed, an organic insulating layer is formed and this organic insulating layer is patterned to form the insulating layer 12. After that, a metal layer is formed, and for example, an insulating layer is also formed, and these metal layer and insulating layer are collectively patterned. At this time, conditions are set such that the etching of the insulating layer proceeds faster than the etching of the metal layer to form the partition 30 comprising the first layer 31 and the second layer 32 shaped as shown in FIG. 4.

After that, the respective layers constituting the organic layer OR are formed by, for example, a vacuum vapor deposition method. At this time, the emission angle of vapor from a evaporation source is referred to as $\theta 1$. The emission angle $\theta 1$ is an angle with respect to a normal N to a substrate SUB which is an object subjected to vapor deposition where the partition 30 is formed. The vapor deposition of the organic layer OR is performed while the evaporation source is moved linearly or rotationally relative to the substrate SUB. Accordingly, the organic layer OR having a uniform film thickness is formed in each sub-pixel.

After that, the upper electrode E2 is formed by, for example, a spattering method. At this time, the emission angle of a material from a target is referred to as $\theta 2$. The emission angle $\theta 2$ is an angle with respect to the normal N to the substrate SUB. The emission angle $\theta 2$ is greater than the emission angle $\theta 1$.

Here, an angle formed by the normal N to the substrate SUB and a virtual line L11 is referred to as $\Theta$. The virtual line L11 is a line passing through the intersection of the second side surface S12 of the first layer 31 and the upper surface U1 of the insulating layer 12, and the lower end of the side surface S22 of the second layer 32. The emission angle $\theta 1$ is less than the angle $\Theta$, and the emission angle $\theta 2$ is greater than the angle $\Theta$ ($\theta 1 < \Theta < \theta 2$).

Therefore, the organic layer OR is formed on the upper surface U1 away from the first layer 31, and the sloping surface S2. In addition, the organic layer OR is also formed on the second supper surface U21 and the side surface S22 of the second layer 32.

The upper electrode E2 is formed on the sloping surface S2, the upper surface U1 between the sloping surface S2 and the first layer 31, and the second side surface S12 of the first layer 31. In addition, the upper electrode E2 is also formed on the second upper surface U21 and the side surface S22 of the second layer 32.

Figure 6A:
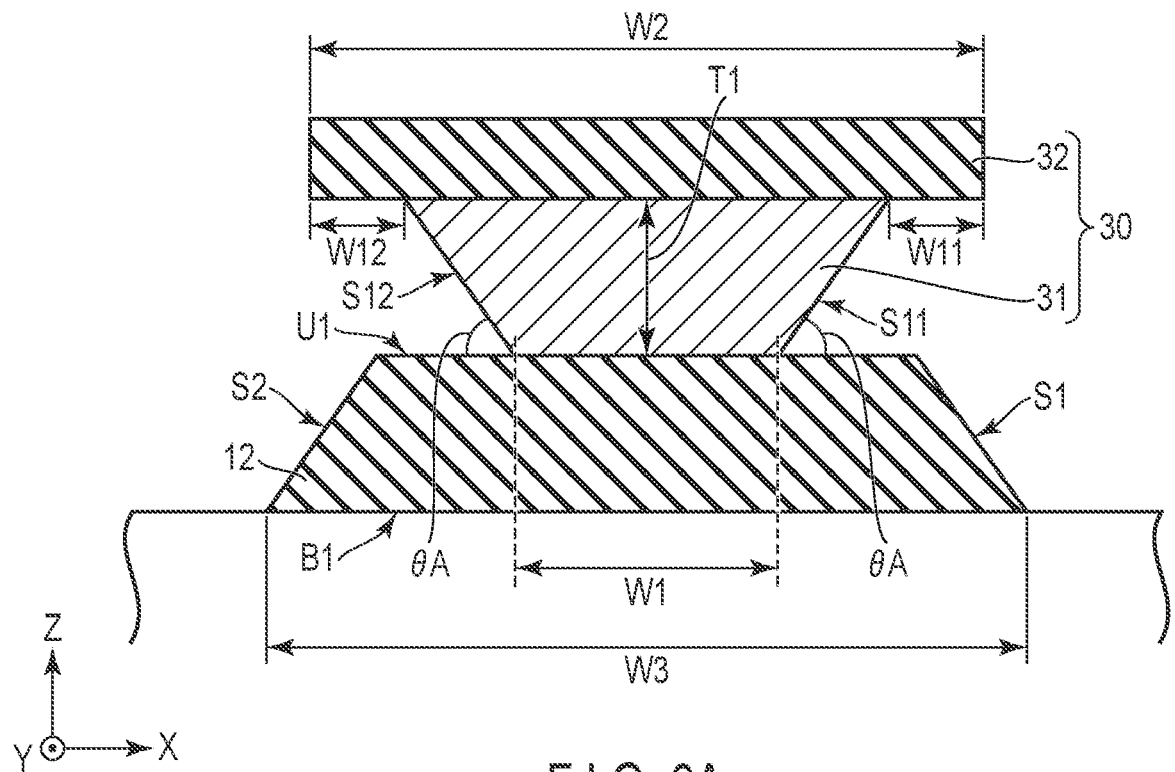
FIG. 6A is an enlarged cross-sectional view showing an example of a partition 30.

FIG. 6A is an enlarged cross-sectional view showing an example of the partition 30.

A width W1 along the first direction X of the first layer 31 increases toward the top along the third direction Z. That is, the first layer 31 has an inverse tapered cross-sectional shape. A thickness T1 along the third direction Z of the first layer 31 is great than or equal to twice the thickness of the organic layer OR. In addition, the thickness T1 is less than the width W1 (T1<W1). For example, the thickness of the organic layer OR is of the order of several hundred nanometers. The thickness T1 is greater than or equal to 500 nm but less than or equal to several micrometers. In addition, the width W1 is about a dozen micrometers.

In the first layer 31, the first side surface S11 and the second side surface S12 each are a sloping surface. An angle θA formed by the first side surface S11 and the upper surface U1 and an angle θA formed by the second side surface S12 and the upper surface U1 each are an acute angle.

In the second layer 32, as a width W11 protruding from the first side surface S11 and a width W12 protruding from the second side surface S12 are increased, vapor deposition of the organic layer OR on the sloping surfaces S1 and S2 is suppressed. However, when the widths W11 and W12 are too large, the vapor deposition of the upper electrode E2 is also limited, and the contact between the upper electrode E2 and the first layer 31 may be inhibited. Therefore, a width W2 along the first direction X of the second layer 32 should preferably be less than or equal to a width W3 along the first direction X of a bottom surface B1 of the insulating layer 12.

Figure 6B:
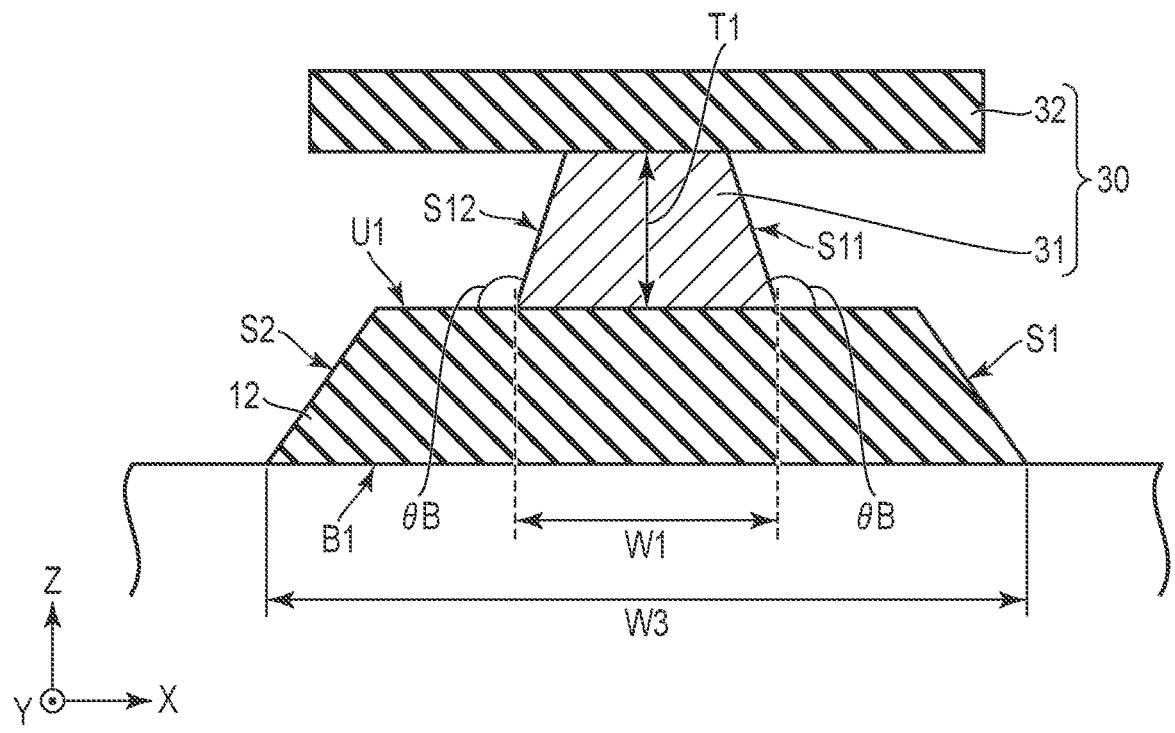
FIG. 6B is an enlarged cross-sectional view showing another example of the partition 30.

FIG. 6B is an enlarged cross-sectional view showing another example of the partition 30.

The example shown in FIG. 6B is different from the example shown in FIG. 6A in the cross-sectional shape of the first layer 31. The width W1 along the first direction X of the first layer 31 decreases toward the top along the third direction Z. That is, the first layer 31 has a forward tapered cross-sectional shape.

In the first layer 31, the first side surface S11 and the second side surface S12 each are a sloping surface. An angle θB formed by the first side surface S11 and the upper surface U1 and an angle θB formed by the second side surface S12 and the upper surface U1 each are an obtuse angle.

As described above, the partition 30 is arranged between the adjacent display elements 20, and the organic layer OR formed without via a fine mask is divided by the partition 30. Therefore, the display element 20 comprising the organic layer OR having a desired shape is provided. Therefore, as compared with when a fine mask is applied, the manufacturing cost can be reduced, and since a process such as positioning of a fine mask is not required, and the organic layer OR having a desired shape can be easily formed. In addition, in the display element 20, the light emitting area can be formed in a predetermined area, and undesired light emission in an area overlapping the insulating layer 12 is also suppressed.

Furthermore, the upper electrode E2 is divided by the partition 30 in the same manner as the organic layer OR, but each upper electrode E2 is electrically connected to the first layer 31 of the partition 30 which is a conductor. The first layer 31 is electrically connected to a feed line having a predetermined potential in the display portion DA or outside the display portion DA. Therefore, a predetermined potential is supplied to the upper electrode E2 of each display element 20 via the partition 30. That is, a potential drop in a part of the upper electrode E2 is suppressed.

Furthermore, in the adjacent display elements 20, undesired current leakage (crosstalk) caused by the connection of the organic layers OR is suppressed. Therefore, desired display performance can be realized in the display element 20.

Figure 7:
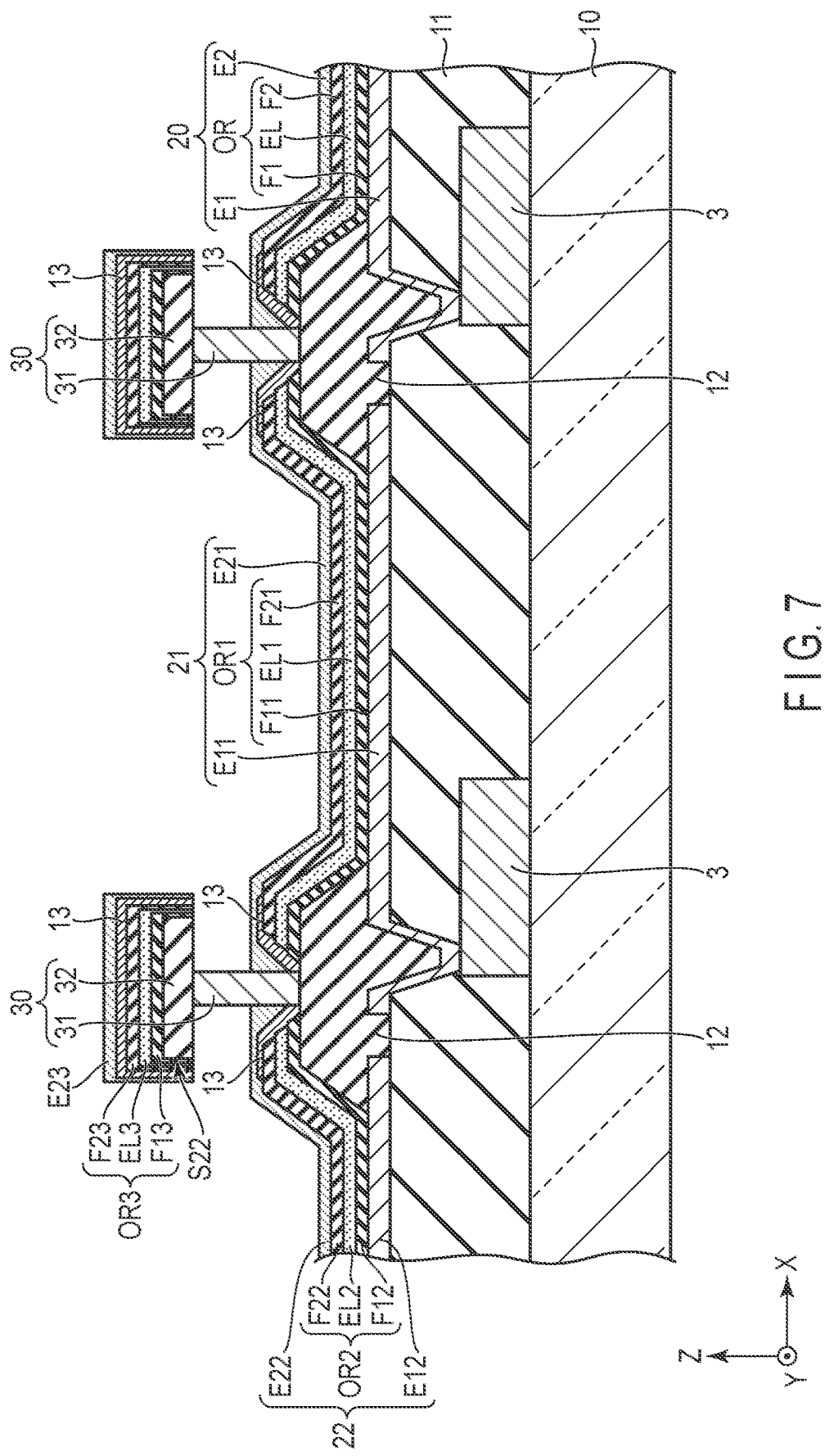
FIG. 7 is a cross-sectional view showing another example of the display element 20.

FIG. 7 is a cross-sectional view showing another example of the display element 20.

The example shown in FIG. 7 is different from the example shown in FIG. 4 in that the peripheral portion of the organic layer OR is covered with an insulating film 13. For example, regarding the organic layer OR1, a peripheral portion on the left side of the drawing and a peripheral portion on the right side of the drawing are covered with the insulating film 13. The organic layer OR1 shown in FIG. 7 has the function layer F11, the light emitting layer EL1 and the function layer FL21, and the peripheral portions of these layers are covered with the insulating film 13. The insulating film 13 is in contact with the upper surface U1 of the insulating layer 12 and the first layer 31 of the partition 30.

When this insulating film 13 is formed on the peripheral portion of the organic layer OR, the insulating film 13 is also formed on the partition 30 in the same manner. On the second layer 32, the insulating film 13 covers the organic layer OR3 and is covered with the upper electrode E23.

The upper electrode E21 is in contact with the uppermost layer (the function layer F21 in FIG. 7) of the organic layer OR1 and the insulating film 13, but is not in contact with the function layer F11 and the light emitting layer EL1. Therefore, undesired current leakage in the peripheral portion of the organic layer OR (for example, such trouble as a flow of current between the lower electrode E11 and the upper electrode E21 through the function layer F11 without through the light emitting layer EL1) or the like is suppressed, and the performance degradation of the display element 20 can be suppressed.

Figure 8:
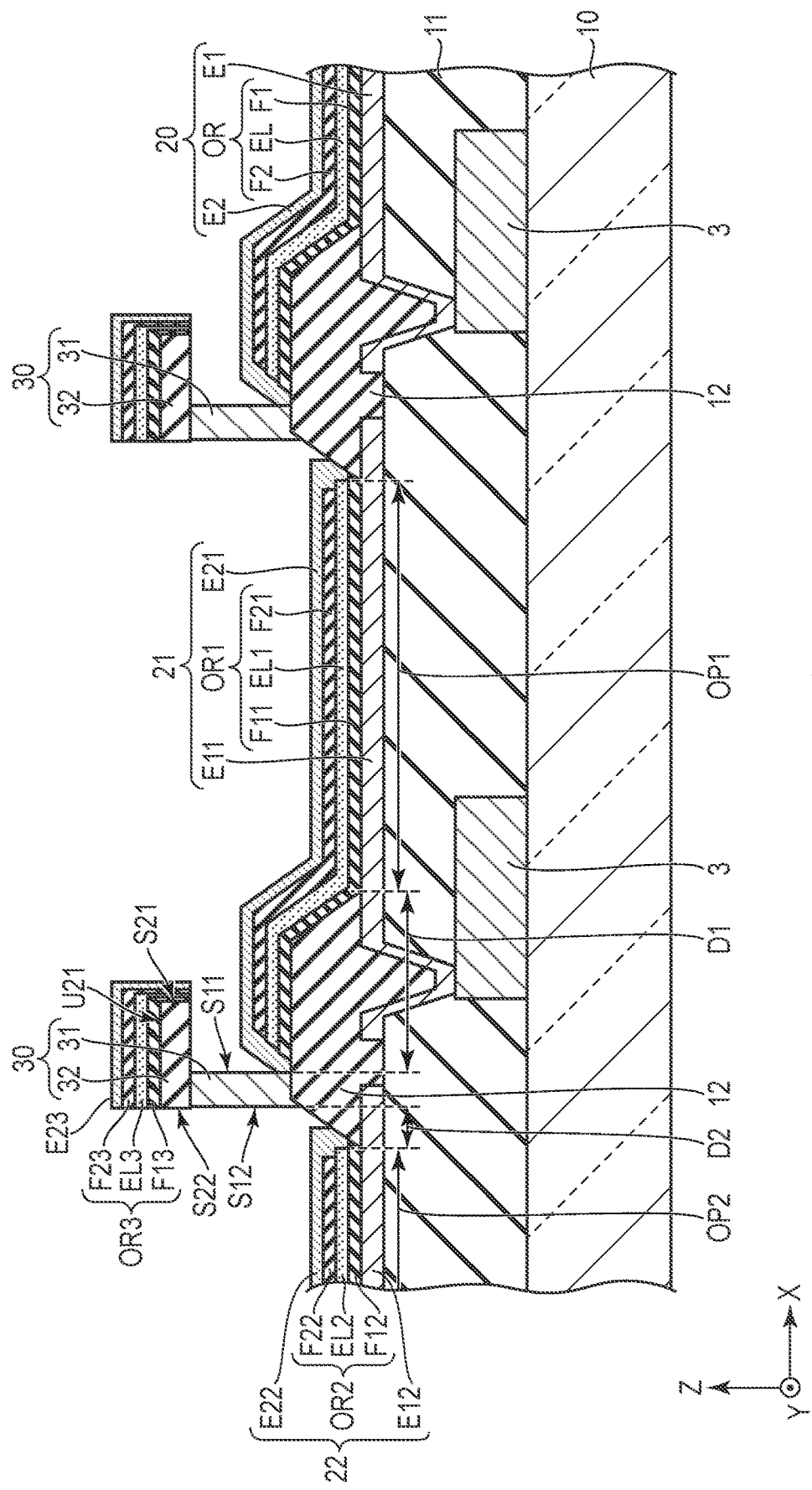
FIG. 8 is a cross-sectional view showing another example of the display element 20.

FIG. 8 is a cross-sectional view showing another example of the display element 20.

The example shown in FIG. 8 is different from the example shown in FIG. 4 in the shape of the partition 30. In particular, the second layer 32 is asymmetrical from a side facing the opening OP1 and a side facing the opening OP2. In the second layer 32, a width protruding from the second side surface S12 toward the opening OP2 is less than a width protruding from the first side surface S11 toward the opening OP1. In the example shown in FIG. 8, the width protruding from the second side surface S12 in the second layer 32 is substantially zero.

The organic layer OR1 is separated from the first side surface S11. The upper electrode E21 is in contact with the first side surface S11 of the first layer 31, and is also in contact with the insulating layer 12 between the first side surface S11 and the organic layer OR1.

The organic layer OR2 is separated from the second side surface S12. The upper electrode E22 is separated from the second side surface S12 of the first layer 31. The upper electrode E22 is in contact with the insulating layer 12 between the second side surface S12 and the organic layer OR2, but exposes the insulating layer 12 in an area close to the first layer 31.

Regarding the position of the partition 30 on the insulating layer 12, for example, the partition 30 is located close to the display element 22 on the upper surface U1. That is, the distance D1 between the first side surface S11 and the opening OP1 is greater than the distance D2 between the second side surface S12 and the opening OP2.

The organic layer OR3 covers the second upper surface U21 of the second layer 32. In the example shown in FIG. 8, the organic layer OR3 also covers the side surface S21 but exposes the side surface S22. The organic layer OR3 is covered with the upper electrode E23. The organic layer OR3 comprises the function layer F13, the light emitting layer EL3 and the function layer F23.

The upper electrode E23 exposes the side surface S22 but may cover the side surface S22.

The first side surface S11 and the second side surface S12 of the first layer 31 are exposed from the organic layer OR3 and the upper electrode E23. That is, the organic layer OR3 is separated from the organic layers OR1 and OR2. In addition, the upper electrode E23 is separated from the upper electrodes E21 and E22.

The above-described partition 30 is arranged between the adjacent display elements 20 or on the upper surface U1 of the insulating layer 12. In the first layer 31 constituting the partition 30, one side surface is in contact with the upper electrode E2 of the opposed display element 20, but the other side surface is separated from the upper electrode E2 of the opposed display element 20. When attention is focused on each display element 20, the partition 30 is arranged on both sides of the opening OP, and one end of the upper electrode E2 is in contact with one side surface of the first layer 31, and the other end of the upper electrode E2 is separated from the other side surface of the first layer 31. Accordingly, the upper electrodes E2 of the display elements 20 arranged in the display portion DA are electrically connected to each other.

Also in the example shown in FIG. 8, the display element 20 comprising the organic layer OR having a desired shape can be provided without the application of a fine mask, and therefore the same effects as the above example can be obtained.

Figure 9:
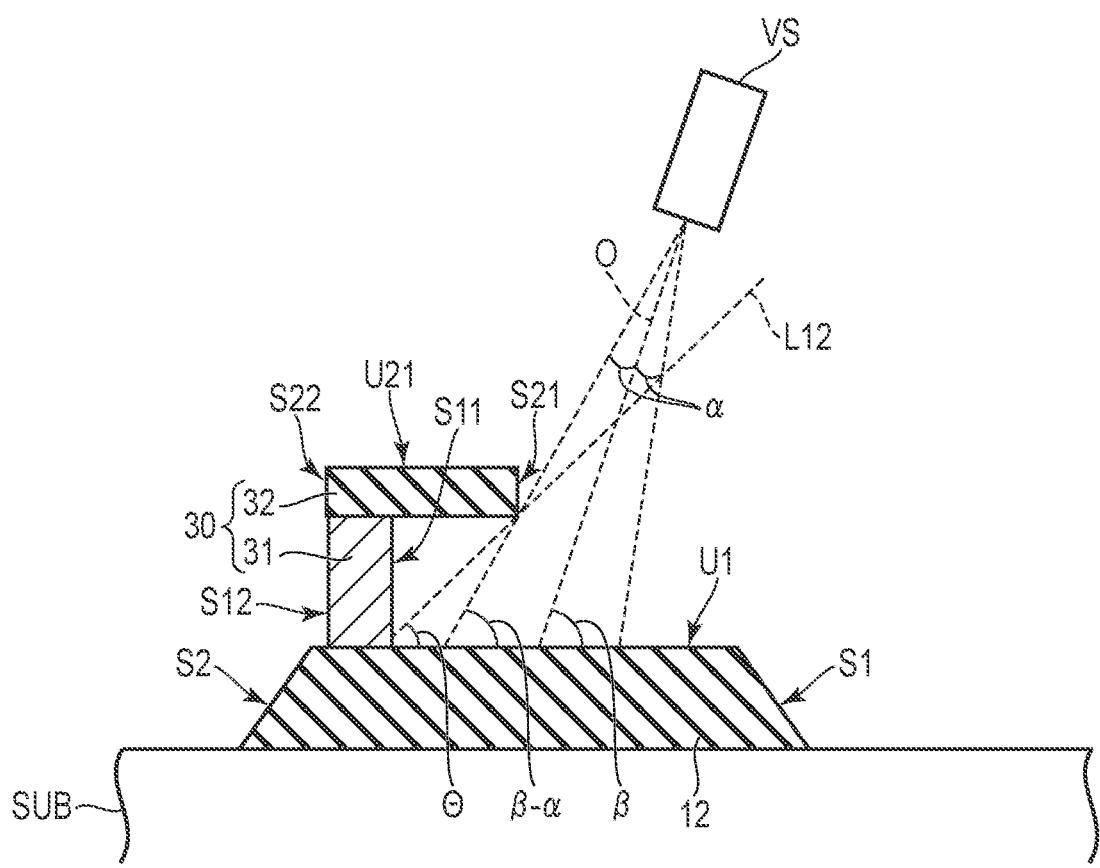
FIG. 9 is an illustration for explaining a process of forming a cross-sectional structure shown in FIG. 8.

FIG. 9 is an illustration for explaining a process of forming the cross-sectional structure shown in FIG. 8.

The respective layers constituting the organic layer OR are formed by, for example, a vacuum vapor deposition method. Note that an oblique vapor deposition method of performing vapor deposition from an oblique direction with respect to the normal to the substrate SUB is applied here. At this time, vapor from the evaporation source VS is emitted at an emission angle $\alpha$ with respect to a center line O. An angle formed by the center line O and the surface of the substrate SUB (here the upper surface U1 of the insulating layer 12) is referred to as $\beta$.

Here, an angle formed by a virtual line L12 and the surface of the substrate SUB is referred to as $\Theta$. The virtual line L12 is a line passing through the intersection of the second side surface S12 of the first layer 31 and the upper surface U1 of the insulating layer 12, and the lower end of the side surface S21 of the second layer 32. An angle $(\beta-\alpha)$ is greater than the angle $\Theta$ $((\beta-\alpha)>\Theta)$.

Therefore, the organic layer OR is formed on the upper surface U1 away from the first layer 31, and the sloping surface S1. In addition, the organic layer OR is also formed on the second upper surface U21 and the side surface S21 of the second layer 32. On the other hand, according to this oblique vapor deposition method, the organic layer OR is hardly formed on the sloping surface S2 of the insulating layer 12 and the side surface S22 of the second layer 32.

Figure 10:
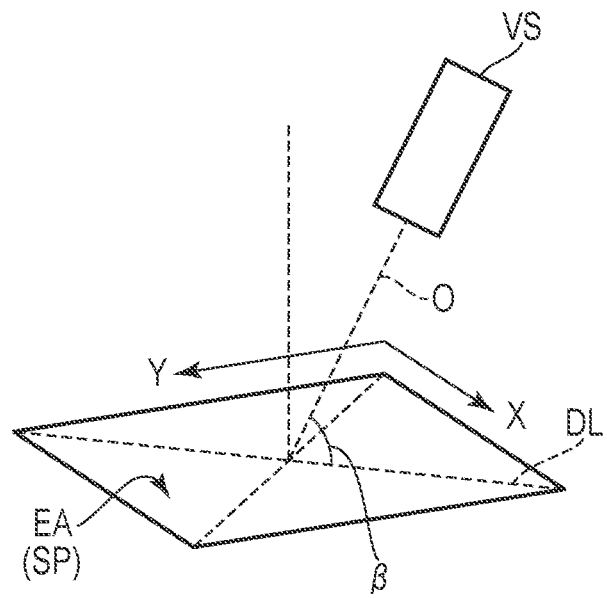

FIG. 10 is an illustration for explaining an example of the vapor deposition method of the organic layer OR.

Here, it is assumed that a light emitting area EA of the sub-pixel SP is in the form of a rectangle having short sides extending along the first direction X and long sides extending along the second direction Y. An angle $\beta$ formed by the center line O of the evaporation source VS and a diagonal line DL of the light emitting area EA is set to satisfy the condition $((\beta-\alpha)>\Theta)$ described with reference to FIG. 9.

The vapor deposition method shown in FIG. 10 is suitable when the partition 30 is in the form of a lattice extending in the first direction X and the second direction Y as shown in FIG. 2.

Figure 11:
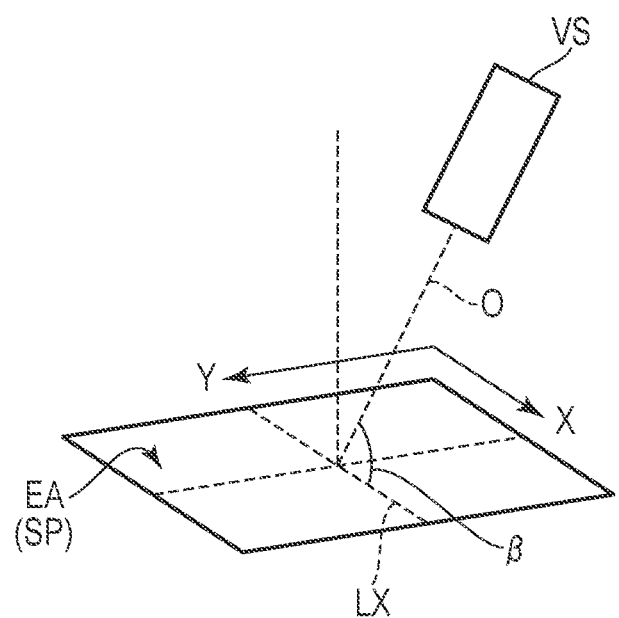

FIG. 11 is an illustration for explaining another example of the vapor deposition method of the organic layer OR.

Here, it is assumed that the light emitting area EA of the sub-pixel SP is in the form of a rectangle having short sides extending along the first direction X and long sides extending along the second direction Y. An angle $\beta$ formed by the center line O of the evaporation source VS and a virtual line LX parallel to the first direction X is set to satisfy the condition $((\beta-\alpha)>\Theta)$ described with reference to FIG. 9.

The vapor deposition method shown in FIG. 11 is suitable when the partitions 30 are in the form of stripes extending in the second direction Y.

The vapor deposition of the organic layer OR shown in FIGS. 10 and 11 is performed while the evaporation source VS is moved linearly relative to the substrate SUB. The direction of the linear movement may be any direction in the X-Y plane. Accordingly, the organic layer OR having a uniform film thickness is formed in each sub-pixel SP.

Figure 12:
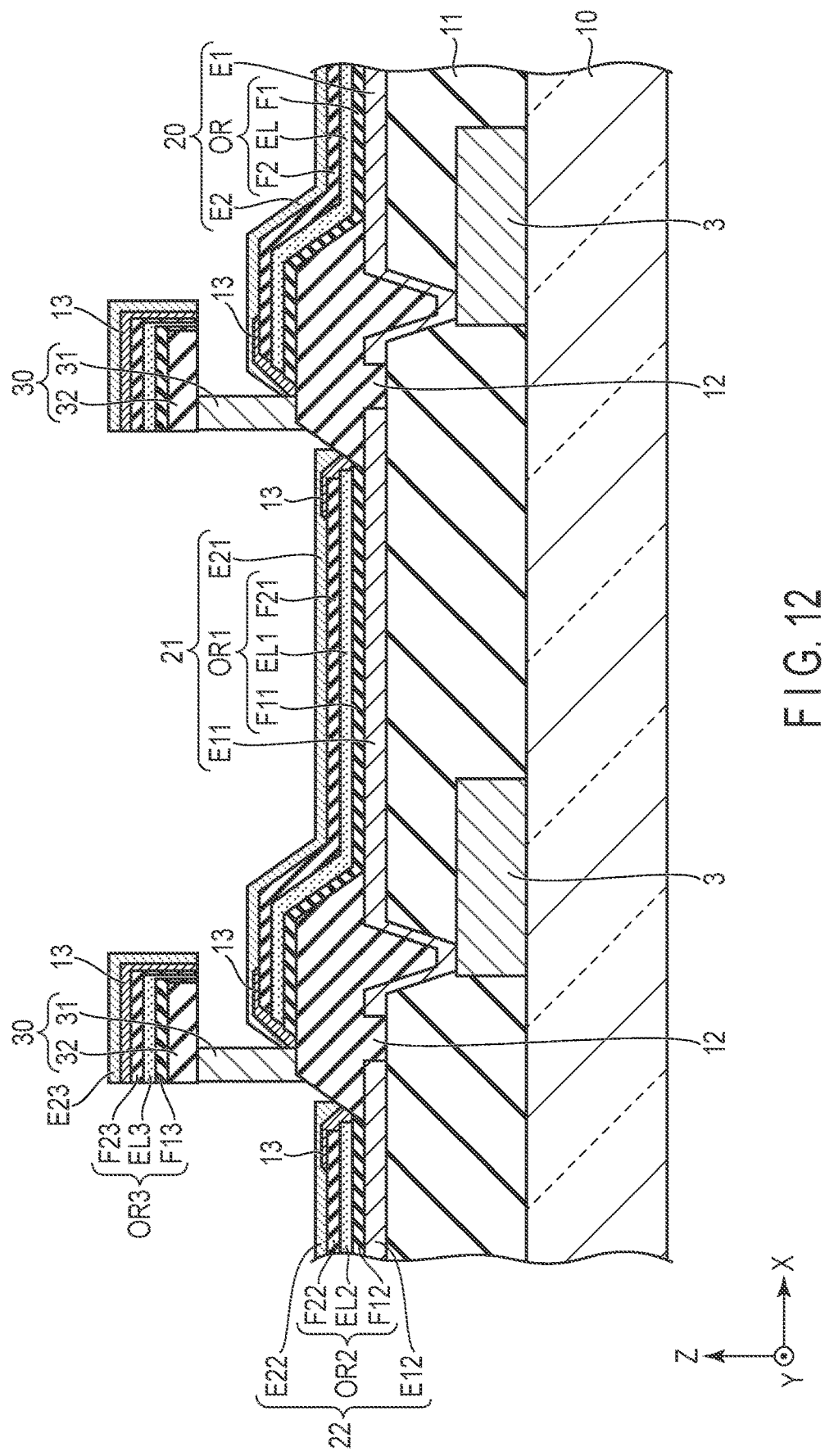
FIG. 12 is a cross-sectional view showing another example of the display element 20.

FIG. 12 is a cross-sectional view showing another example of the display element 20.

The example shown in FIG. 12 is different from the example shown in FIG. 8 in that the peripheral portion of the organic layer OR is covered with the insulating film 13. For example, regarding the organic layer OR1, a peripheral portion on the left side of the drawing and a peripheral portion on the right side of the drawing are covered with the insulating film 13. The organic layer OR1 shown in FIG. 12 has the function layer F11, the light emitting layer EL1 and the function layer F21, but the peripheral portions of these layers are covered with the insulating film 13.

When this insulating film 13 is formed on the peripheral portion of the organic layer OR, the insulating film 13 is also formed on the partition 30 in the same manner. On the second layer 32, the insulating film 13 covers the organic layer OR3 and is covered with the upper electrode E23.

The upper electrode E21 is in contact with the uppermost layer (the function layer F21 in FIG. 12) of the organic layer OR1 and the insulating film 13, but is not in contact with the function layer F11 and the light emitting layer EL1. Therefore, undesired current leakage in the peripheral portion of the organic layer OR (for example, such trouble as a flow of current between the lower electrode E11 and the upper electrode E21 through the function layer F11 without through the light emitting layer EL1) or the like is suppressed, and the performance degradation of the display element 20 can be suppressed.

According to the above embodiment, a display device capable of suppressing performance degradation of a display element can be provided.

All display devices, which are implementable by a person of ordinary skill in the art through proper design changes to the display device described above as the embodiment of the present invention, come within the scope of the present invention as long as they are in keeping with the spirit of the present invention.

Various modifications are easily conceivable within the category of the idea of the present invention by a person of ordinary skill in the art, and these modifications are also considered to fall within the scope of the present invention. For example, additions, deletions or changes in design of the constituent elements or additions, omissions or changes in condition of the processes may be properly made to the above embodiment by a person of ordinary skill in the art, and these modifications also fall within the scope of the present invention as long as they encompass the spirit of the present invention.

Furthermore, the other advantages of the aspects described in the embodiment, which are obvious from the description of the specification or which are properly conceivable by a person of ordinary skill in the art, are considered to be achievable by the present invention as a matter of course.

What is claimed is:

1. A display device comprising:
   an insulating substrate;
   a first insulating layer arranged on the insulating substrate;
   a first lower electrode, a second lower electrode, and a third lower electrode arranged on the first insulating layer in this order;
   a second insulating layer arranged on the first insulating layer, and including a first opening overlapping the first lower electrode, a second opening overlapping the second lower electrode, and a third opening overlapping the third lower electrode;
   a first partition arranged on the second insulating layer between the first opening and the second opening;
   a second partition arranged on the second insulating layer between the second opening and the third opening;
   a first organic layer including a light emitting layer, arranged in the first opening, and covering the first lower electrode;
   a first upper electrode covering the first organic layer;
   a second organic layer including a light emitting layer, arranged in the second opening, and covering the second lower electrode; and
   a second upper electrode covering the second organic layer, wherein
   each of the first partition and the second partition has:
   a first layer arranged on the second insulating layer and formed of a metal material; and
   a second layer arranged on the first layer and protruding from the first layer,
   the first layer is in a form of a lattice in planar view,
   the second layer of the first partition is asymmetrical from a side facing the first opening and a side facing the second opening,
   the second layer of the second partition is asymmetrical from a side facing the second opening and a side facing the third opening,
   the second upper electrode is located between the first partition and the second partition, is in contact with the first layer directly below the second layer of the first partition, and is separated from the first layer of the second partition.

2. The display device of claim 1, wherein
   the first organic layer is separated from the first partition, and
   the first upper electrode is in contact with the second insulating layer between the first partition and the first organic layer.

3. The display device of claim 1, wherein
   the second organic layer is separated from the second partition, and
   the second upper electrode is in contact with the second insulating layer between the second partition and the second organic layer.

4. The display device of claim 3, wherein a distance between the first partition and the second opening is greater than a distance between the first partition and the first opening.

5. The display device of claim 1, further comprising an insulating film covering a peripheral portion of the first organic layer.

6. The display device of claim 1, wherein
   the second layer of the first partition has a second upper surface,
   the display device further comprises:
   a third organic layer covering the second upper surface; and
   a third upper electrode covering the third organic layer, the third organic layer is separated from the first organic layer and the second organic layer, and
   the third upper electrode is separated from the first upper electrode and the second upper electrode.

7. The display device of claim 6, wherein the first organic layer, the second organic layer and the third organic layer each include a light emitting layer of a same color.

8. The display device of claim 7, wherein the first organic layer, the second organic layer and the third organic layer each further include at least one of a hole injection layer, a hole transport layer, an electron injection layer and an electron transport layer.

* * * * *